United States Patent
Ahn

(10) Patent No.: US 7,498,218 B2
(45) Date of Patent: *Mar. 3, 2009

(54) SEMICONDUCTOR DEVICE WITH LOW CONTACT RESISTANCE AND METHOD FOR FABRICATING THE SAME

(75) Inventor: Tae-Hang Ahn, Yeoksam-dong (KR)

(73) Assignee: Hynix Semiconductor Inc., Icheon-si (KR)

( * ) Notice: Subject to any disclaimer, the term of this patent is extended or adjusted under 35 U.S.C. 154(b) by 104 days.

This patent is subject to a terminal disclaimer.

(21) Appl. No.: 11/025,487

(22) Filed: Dec. 28, 2004

(65) Prior Publication Data

US 2005/0275102 A1    Dec. 15, 2005

(30) Foreign Application Priority Data

Jun. 9, 2004    (KR) .................. 10-2004-0042309

(51) Int. Cl.
*H01L 21/8238* (2006.01)
(52) U.S. Cl. ..................... 438/233; 438/607
(58) Field of Classification Search ................ 438/233, 438/300, 597, 607, 653, 655, 656
See application file for complete search history.

(56) References Cited

U.S. PATENT DOCUMENTS

| 4,966,868 | A | * | 10/1990 | Murali et al. ............... 438/232 |
| 5,427,981 | A | | 6/1995 | Choi |
| 6,770,954 | B2 | * | 8/2004 | Lee et al. .................... 257/616 |
| 7,078,755 | B2 | * | 7/2006 | McTeer et al. .............. 257/296 |
| 2002/0045307 | A1 | | 4/2002 | Kittl et al. |
| 2006/0237766 | A1 | * | 10/2006 | Ahn .......................... 257/314 |

FOREIGN PATENT DOCUMENTS

JP    02-034930    2/1990
KR    2000-0043920    7/2000

* cited by examiner

*Primary Examiner*—Mark Prenty
(74) *Attorney, Agent, or Firm*—Townsend and Townsend and Crew LLP

(57) ABSTRACT

A semiconductor device with a low contact resistance and a method for fabricating it are described. The semiconductor device includes a substrate structure with a contact hole and a contact plug formed on the contact hole. The contact plug is provided with an epitaxial silicon layer and a metal layer formed on the epitaxial silicon layer. The method for fabricating such semiconductor device includes steps of exposing a portion of a substrate structure to form a contact hole, then forming an epitaxial silicon layer and a metal layer.

8 Claims, 6 Drawing Sheets

SEMICONDUCTOR DEVICE WITH LOW CONTACT RESISTANCE AND METHOD FOR FABRICATING THE SAME

FIELD OF THE INVENTION

The present invention relates to semiconductor technology; and, more particularly, to a semiconductor device with a low contact resistance and a method for fabricating the same.

DESCRIPTION OF RELATED ARTS

As a semiconductor device has been highly integrated, the size of the semiconductor device has become smaller. Thus, for a dynamic random access memory (DRAM) device, the large scale of integration and the decreased size have impacted the contact region of a cell transistor. That is, as the semiconductor device has become smaller, the area for the contact region is decreased. Unfortunately, however, this decreased area results in an increase in contact resistance and a decrease in drive current, thereby degrading performance of the semiconductor device, e.g., degradation of a refresh characteristic and a write recovery characteristic (WR).

To reduce the contact resistance and to improve the drive current, the junction region of the substrate is implanted with a high concentration of dopant. Alternatively, a high concentration of phosphorus (P), a currently used dopant, is introduced into a polysilicon layer for use in forming the contact. These methods, however, are disadvantageous in that the leakage current increases and the refresh characteristic (tREF) and data retention time are degraded.

The above mentioned polysilicon layer is often deposited at a batch-type furnace by using a gas of silane ($SiH_4$)/phosphine ($PH_3$) at a temperature ranging from approximately 500° C. to approximately 600° C. At this time, the doping concentration of phosphorus ranges from $0.1 \times 10^{20}$ atoms/$cm^3$ to $3.0 \times 10^{20}$ atoms/$cm^3$. Also, even if the deposition of the polysilicon layer proceeds under atmospheric pressure with use of nitrogen as a purging gas, a thin oxide layer is formed on an interface between the polysilicon layer and the substrate due to oxygen produced with a concentration of several parts per million (ppm). This thin oxide layer is one cause of increased the contact resistance, and the polysilicon layer has a high level of contact resistance. As a result, the semiconductor device is denser, but the method for forming a contact with use of the polysilicon layer has limitations in improving the contact resistance and device characteristics.

One approach for overcoming the above described problems is to form an epitaxial silicon layer with use of a single-type chemical vapor deposition (CVD) apparatus. One representative method is a selective epitaxy growth (SEG) method that selectively grows an epitaxial silicon layer from an exposed substrate. Although a good quality of the epitaxial silicon layer can be obtained with an intended thickness through the use of the SEG method, the SEG method is required to proceed with a hydrogen bake at a high temperature of 850° C. and a high thermal process for growing the epitaxial silicon layer at a temperature of 800° C. Therefore, it is difficult to apply this SEG method to semiconductor device manufacturing processes.

FIG. 1 is a diagram showing a semiconductor substrate structure, wherein a contact plug is formed by employing a polysilicon layer or an epitaxial silicon layer. Herein, reference numerals 101, 102, 103, 104, and 105 are a silicon substrate, a gate structure, a junction region, an insulation layer, and a doped polysilicon or doped epitaxial silicon layer, respectively.

Recently, a method for forming an epitaxial silicon structure with use of a solid phase epitaxy (SPE) method is one focused approach for overcoming the problem arising when the polysilicon layer and the above mentioned limitation in the SEG method. The reason for this recent focus on the SPE method is because the SPE method makes it possible to form the epitaxial silicon structure in a low temperature along with a low doping concentration. Also, the SPE method can be carried out by using a low doping concentration.

In accordance with the SPE method, an amorphous silicon layer is formed by doping with a relatively low concentration of phosphorus at a temperature ranging from approximately 500° C. to approximately 650° C. along with use of $SiH_4/PH_3$ gas. For example, the concentration of phosphorus ranges from $1 \times 10^{19}$ atoms/$cm^3$ to $1 \times 10^{20}$ atoms/$cm^3$. While the SPE method is carried out, an epitaxial silicon layer is formed at bottom and the amorphous silicon layer is formed on the epitaxial silicon layer.

Then, a thermal process is carried out at a low temperature ranging from approximately 550° C. to approximately 650° C. in an atmosphere of nitrogen for approximately 30 minutes to approximately 10 hours. From this thermal process, the epitaxial silicon layer is regrown from an interface of a substrate to an upper region of a contact, and thus, SPE refers to this regrown epitaxial silicon layer.

As descried above, when the polysilicon layer is used as the contact material, a doping concentration of phosphorus is greater than $1 \times 10^{20}$ atoms/$cm^3$ in order to decrease the contact resistance. However, there is a still problem of the degraded refresh characteristic. Since the epitaxial silicon layer is improved with an interface characteristic, it is possible to maintain a relatively low level of the contact resistance even if a low concentration of phosphorus is applied.

The large scale of integration in a sub-100 nm semiconductor technology, however gives rise to a need for maintaining the contact resistance much lower. Hence, the epitaxial silicon layer still has limitation in overcoming resistivity since the resistivity of the epitaxial silicon is about $1 \times 10^{-3}$ mΩ-cm and it is difficult to obtain the resistivity less than the above value. Accordingly, in case of applying the epitaxial silicon layer in a sub-100 nm or next generation semiconductor technology, it is required to develop a process for forming a contact plug with a much lowered contact resistance compared with the contact resistance when the epitaxial silicon layer is employed. Also, it is still required to secure the reliability and yields of the semiconductor devices.

SUMMARY OF THE INVENTION

This invention provides a semiconductor device with a low contact resistance sufficient to obtain electric characteristics of an ultra highly integrated semiconductor device and a method for fabricating the same. In accordance with an aspect of the present invention, there is provided a semiconductor device, including: a substrate structure provided with a contact hole to expose a predetermined portion thereof; and a contact plug formed on the contact hole, wherein the contact plug is provided with an epitaxial silicon layer filled into a portion of the contact hole and a metal layer formed on the epitaxial silicon layer by filling a remaining portion of the contact hole.

In accordance with another aspect of the present invention, there is provided a method for fabricating a semiconductor device, including the steps of: exposing a portion of a substrate structure, thereby forming a contact hole; and sequentially forming an epitaxial silicon layer and a metal layer on the contact hole, thereby obtaining a contact plug.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A semiconductor device with a low contact resistance and a method for fabricating the same in accordance with a preferred embodiment of the present invention will be described in detail with reference to the accompanying drawings.

In the following preferred embodiment of the present invention, in addition to the use of epitaxial silicon to obtain a lowered contact resistance, it is proposed to additionally use a metal as a contact plug material. As well is known, using the metal as the contact plug material is advantageous in respect of a contact resistance since metals have resistivity about 1000 times lower than that of silicon. Also, it is possible to exclude effects of a dopant on the refresh characteristic since there is no diffusion of dopants from the contact plug to a junction region. Additionally, those contamination and deep level impurity problems occurring as metal atoms make direct contacts with the epitaxial silicon can be solved by employing a silicide process for inducing the employed metal to react with an epitaxial silicon layer grown with a predetermined thickness. Hereinafter, this specific structure of the contact plug will be explained in more detail.

Figure 1:
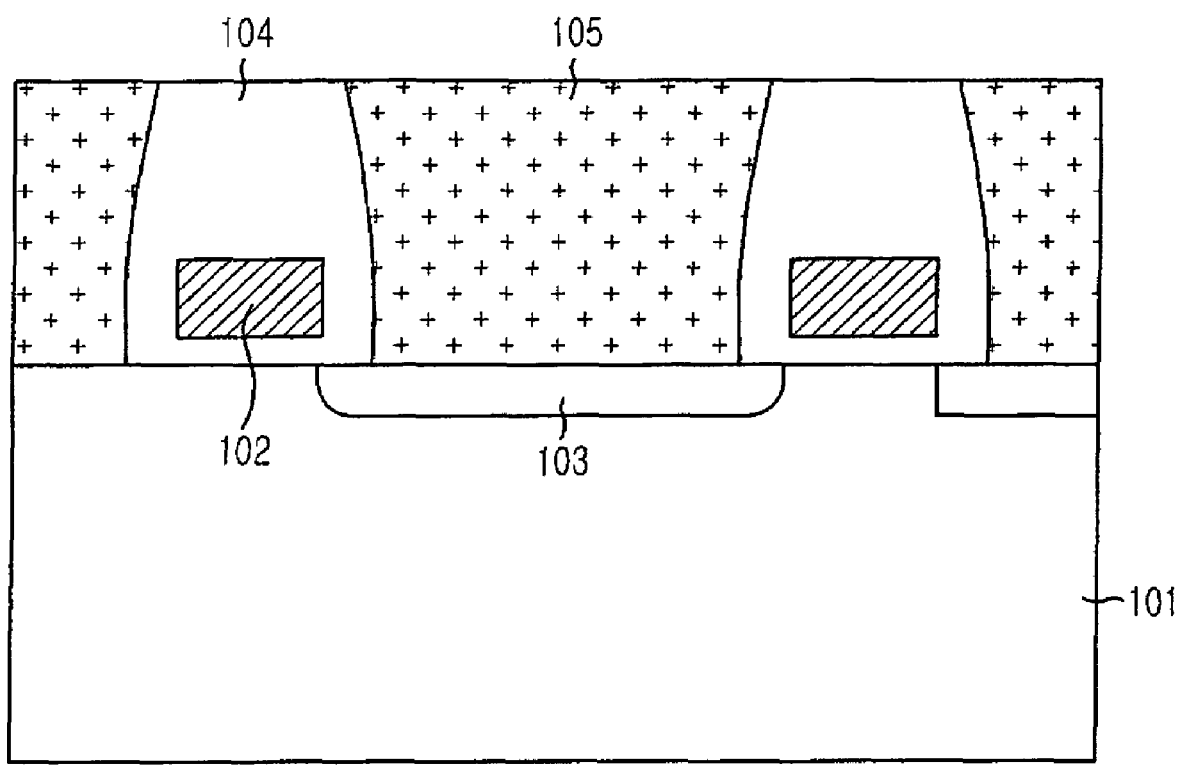
FIG. 1 is a diagram showing a semiconductor substrate structure, wherein a conventional contact plug is formed by employing one of polysilicon and epitaxial silicon.
Figure 2:
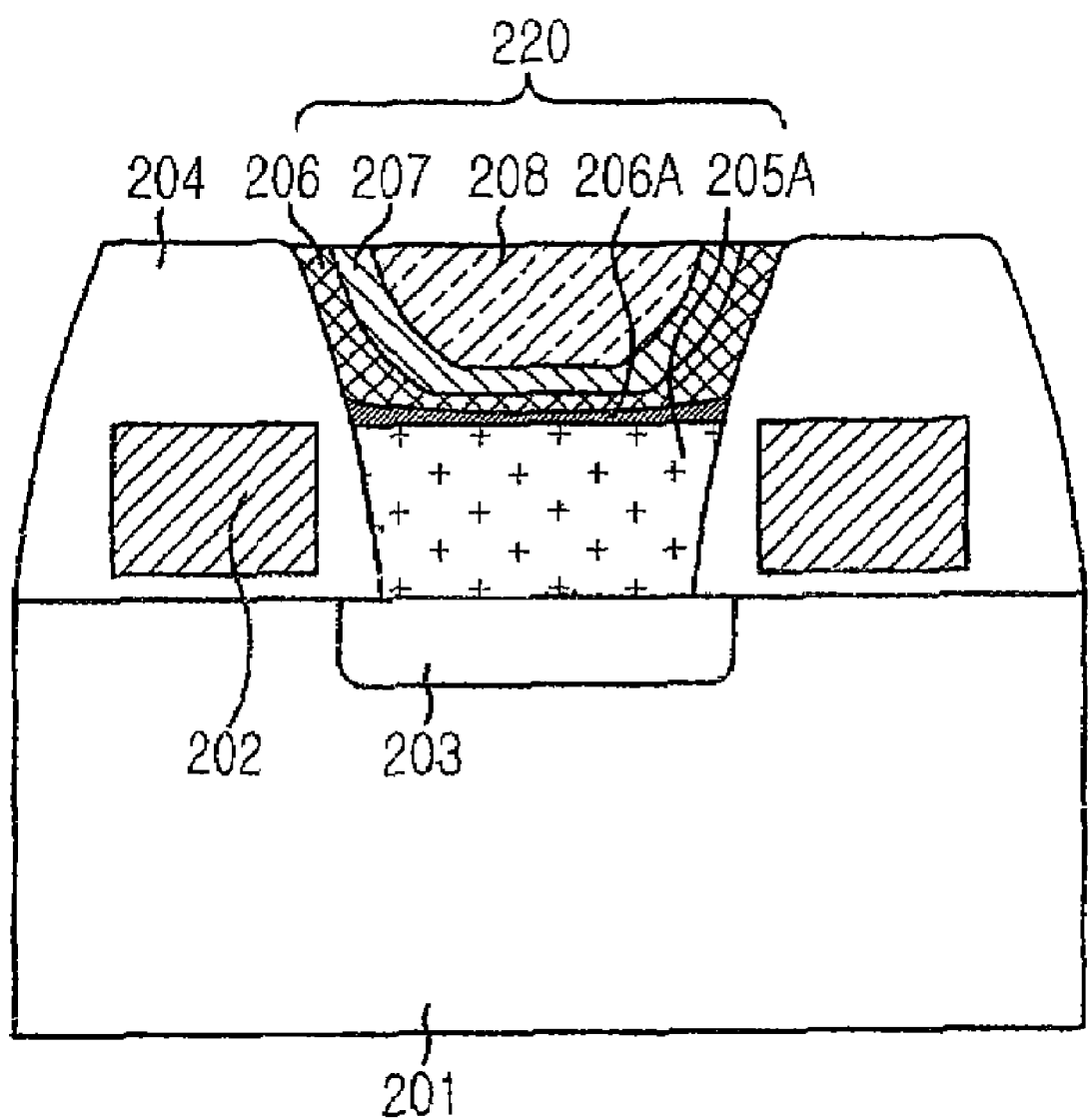
FIG. 2 is a diagram showing a semiconductor substrate structure, wherein a contact plug is formed in accordance with a preferred embodiment of the present invention.

FIG. 2 is a diagram showing a portion of a dynamic random access memory (DRAM) device, wherein a contact plug structure is formed in accordance with a preferred embodiment of the present invention.

As shown, a number of transistors including gate structures 202 and a junction region 203 are formed on a silicon substrate 201. A contact plug 220 is formed on the junction region 203 disposed between a contact hole 100 formed by etching a predetermined portion of an insulation layer 204 encompassing the gate structures 202.

In detail, the contact plug 220 includes: an epitaxial silicon layer 205A formed on the substrate 201 and filled into a partial portion of the contact hole 100; a metal silicide layer 206A and a barrier metal layer 207 thinly formed on the epitaxial silicon layer 205A and sidewalls of the contact hole 100; and a metal layer 208 formed on the barrier metal layer 207 and filled into the remaining portion of the contact hole 100. Especially, the metal silicide layer 206A is obtained by applying a thermal process to an initially deposited metal layer based on a material selected from a group consisting of titanium (Ti), cobalt (Co) and nickel (Ni). That is, the metal silicide layer 206A can be one of a titanium silicide ($TiSi_2$) layer, a cobalt silicide ($CoSi_2$) layer and a nickel silicide (NiSi) layer. The barrier metal layer 207 is made of a material such as titanium nitride (TiN) or tungsten nitride (WN). The metal layer 208 is made of tungsten (W).

Particularly, the epitaxial silicon layer 205A is formed by employing solid phase epitaxy (SPE) method and is not subjected to a thermal process. At this time, the epitaxial silicon layer 205A has a doping concentration of phosphorus (P) or arsenic (As) in a range from approximately $1 \times 10^{18}$ atoms/$cm^3$ to approximately $1 \times 10^{21}$ atoms/$cm^3$ and a resistivity of approximately $1 \times 10^{-3}$ mΩ-cm. Compared with polysilicon, the epitaxial silicon layer 205A has a lower resistivity value in a relatively low doping concentration. Also, the metal silicide layer 206A, the barrier metal layer 207 and the metal layer 208 have lower resistivity values than the epitaxial silicon layer 205A. Therefore, the contact plug obtained in accordance with the present invention has resistivity lower than a conventional contact plug.

FIGS. 3A to 3D are cross-sectional views illustrating a method for forming a contact plug in accordance with the preferred embodiment of the present invention. Herein, the same reference numerals are used for the same configuration elements shown in FIG. 2.

Figure 3A:
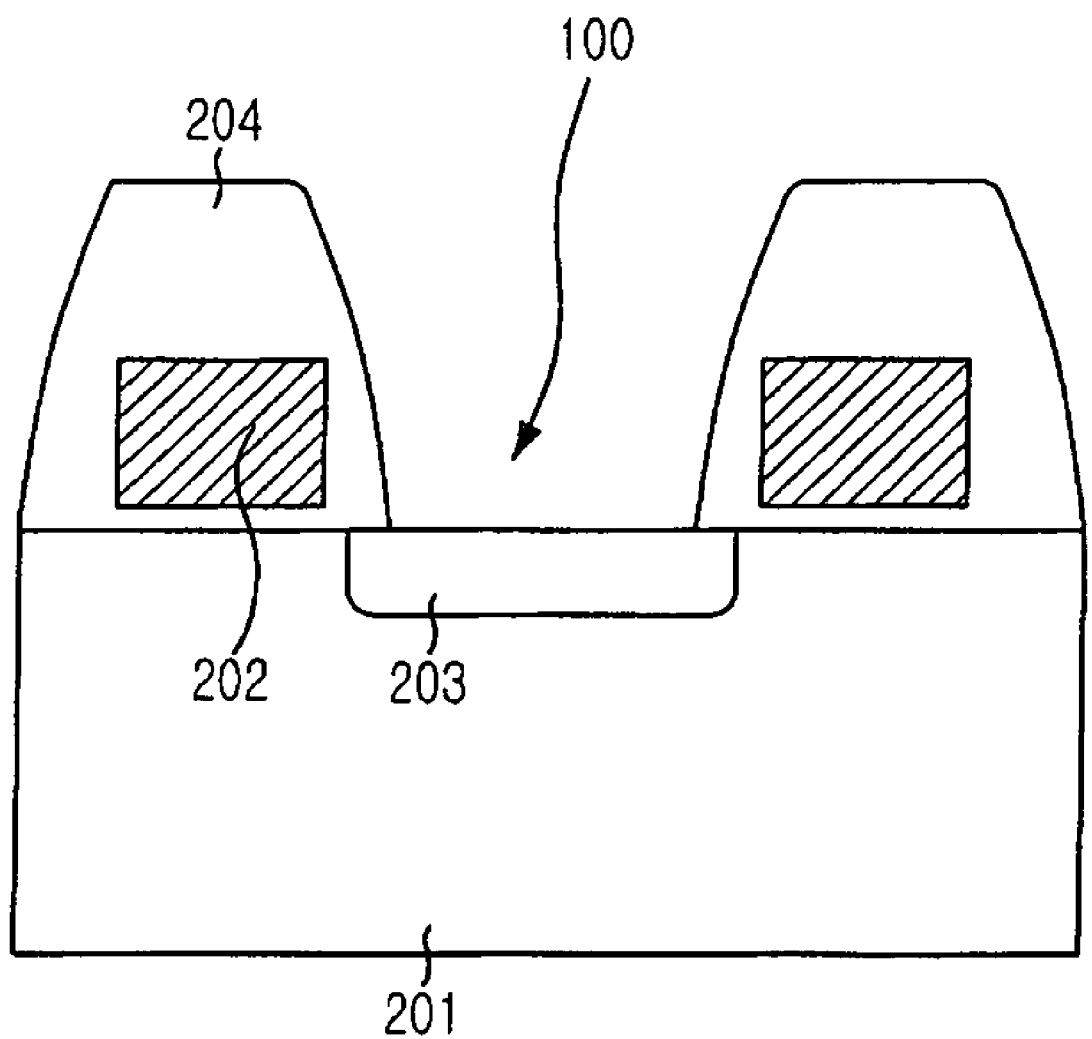
FIGS. 3A to 3D are cross-sectional views illustrating a method for forming a contact plug in accordance with the preferred embodiment of the present invention.

Referring to FIG. 3A, a number of transistors are formed by forming gate structures 202 on the substrate 201 and then a junction region 203 in a portion of the substrate 201 disposed between the gate structures 202. An insulation layer 204 covering a bottom part, an upper part and sidewalls of each gate structure 202 is formed in the course of forming the transistors and after the transistor formation. Although the insulation layer 204 is illustrated as one layer, the insulation layer 204 is multi-layered by including a gate insulation layer, a mask insulation layer and a spacer insulation layer. Then, a portion of the insulation layer 204 is opened to form a contact hole 100, which is filled with a plug material.

Figure 3B:
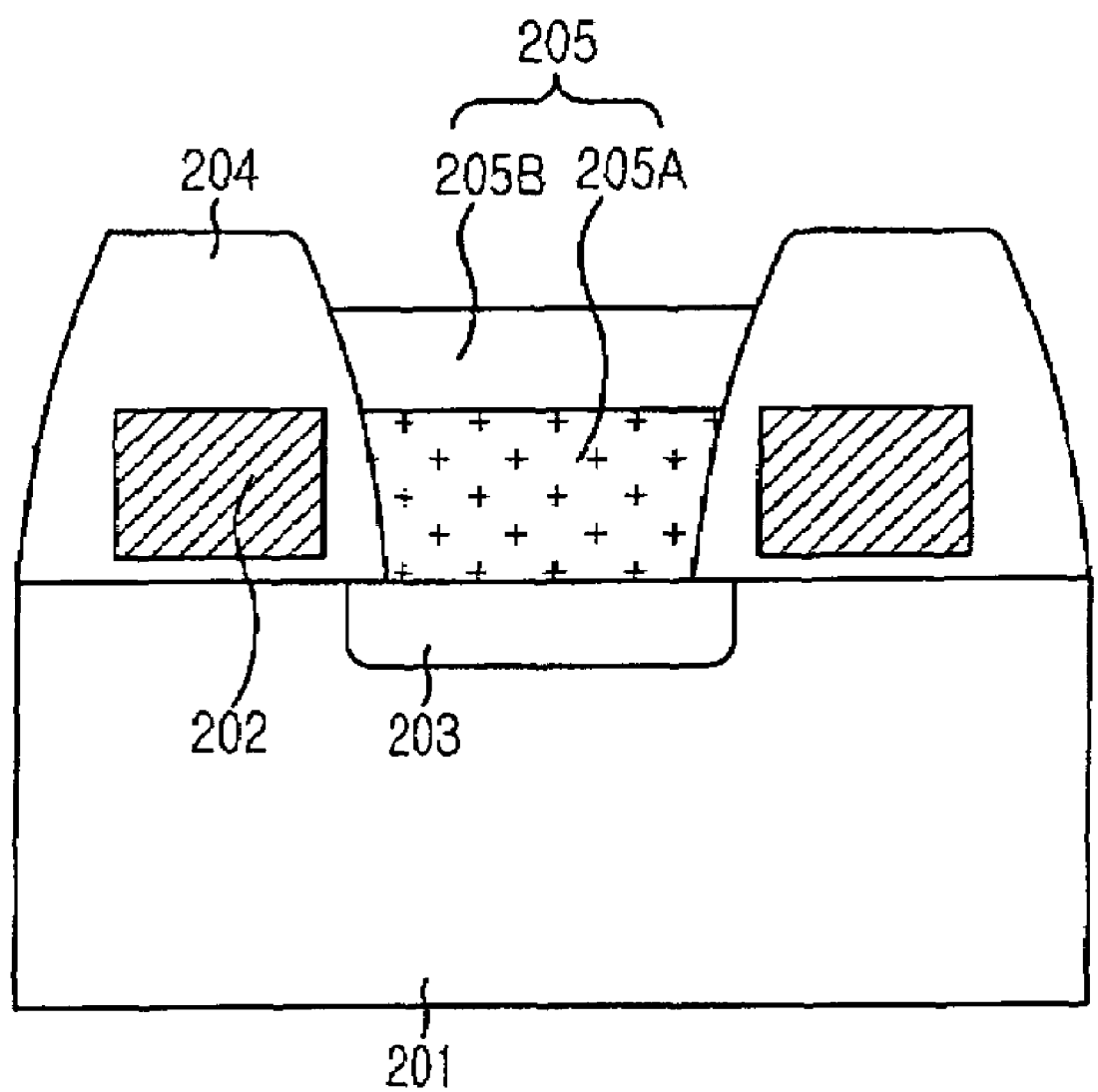

Referring to FIG. 3B, an epitaxial silicon structure 205 is formed by employing a solid phase epitaxy (SPE) method performed at a temperature ranging from approximately 500° C. to approximately 700° C. with use of a gas of silane ($SiH_4$)/phosphine ($PH_3$). Also, the SPE method is carried out at a chemical vapor deposition (CVD) apparatus. Hereinafter, the epitaxial silicon structure 205 obtained by employing the SPE method will be referred to as a SPE-silicon structure. The SPE-silicon structure 205 that is not subjected to a thermal process includes an epitaxial silicon layer 205A formed on an interface of the substrate 201, e.g., the junction region 203, and an amorphous silicon layer 205B formed on the epitaxial layer 205A. At this time, the SPE-silicon structure 205 is doped with phosphorus (P) or arsenic (As) having a concentration in a range from approximately $1 \times 10^{18}$ atoms/$cm^3$ to approximately $1 \times 10^{21}$ atoms/$cm^3$ As described above, in the conventional method, the originally formed epitaxial silicon layer on the interface of the substrate is induced to regrow towards the amorphous silicon layer by performing a thermal process at a temperature ranging from approximately 550° C. to approximately 650° C. for approximately 30 minutes to approximately 10 hours. As a result of this regrowth of the epitaxial silicon layer, the contact hole is filled with the epitaxial silicon layer.

Figure 3C:
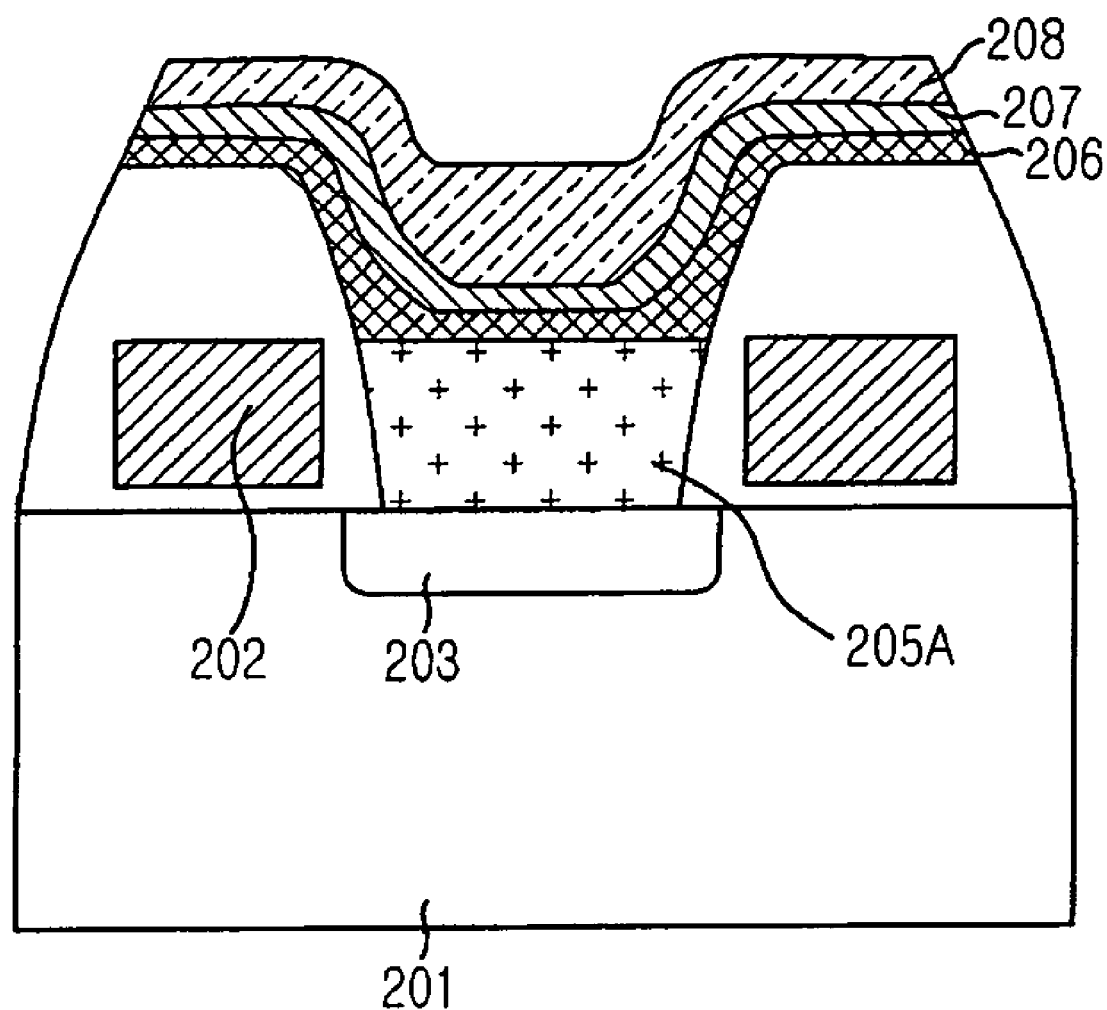

However, instead of regrowing the epitaxial silicon layer 205A to fill the contact hole 100, a different approach of filling the contact hole 100 is suggested in the present invention. That is, in accordance with the present invention, the amorphous silicon layer 205B is removed from the SPE-silicon structure 205, and then, a metal silicide layer, a barrier metal layer and a metal layer are sequentially formed on the epitaxial silicon layer 205A, thereby filling the contact hole 100. With reference to FIG. 3C, detailed description on the contact hole burial will be provided.

Referring to FIG. 3C, the amorphous silicon layer 205B is removed by performing a wet etching process and/or a dry etching process. Then, a first metal layer 206, a second metal layer 207 and a third metal layer 208 are sequentially formed on the epitaxial silicon layer 205A. Herein, the first metal layer 206 is based on a material selected from a group consisting of Ti, Co and Ni. The second metal layer 207 which serves as a barrier metal layer is made of TiN and WN. Also, the third metal layer is made of W.

Figure 3D:
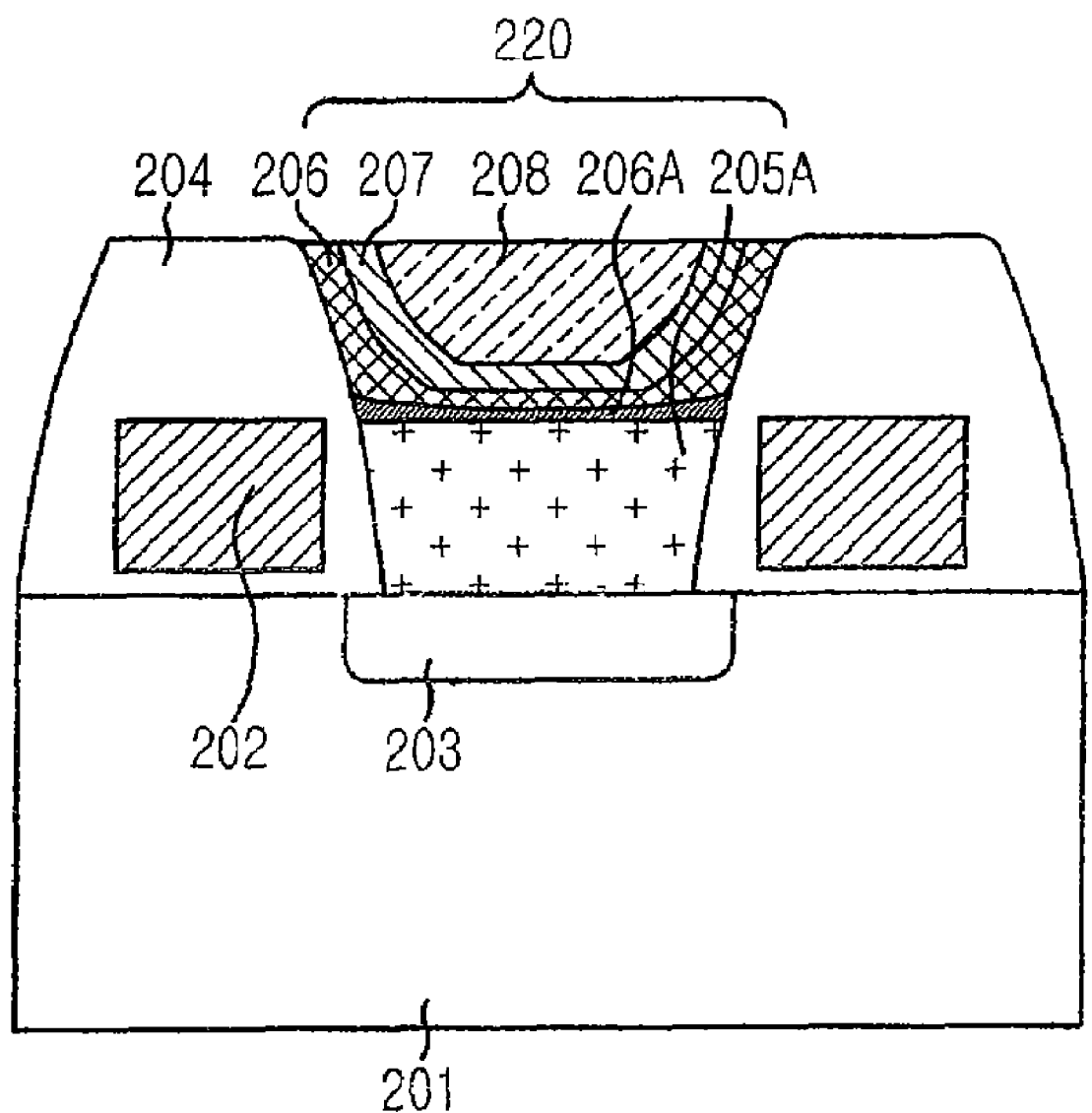

Referring to FIG. 3D, an etch-back process or a chemical mechanical polishing (CMP) process is performed until the first metal layer 206, the second metal layer 207 and the third metal layer 208 remain within the contact hole 100. Herein, the first metal layer 206 becomes a metal silicide layer 206A after a subsequent thermal process. That is, the first metal layer 206 becomes a $TiSi_2$, $CoSi_2$ or $NiSi$ layer.

Preferably, prior to employing the SPE method, an ex-situ wet cleaning and/or a dry cleaning process is applied to an exposed portion of the substrate 201, i.e., the junction region 203 of the substrate 201 in order to the epitaxial silicon layer 205A is grown well from the substrate 201. The wet cleaning process uses a cleaning chemical of hydrogen fluoride (HF). For the dry cleaning process, a plasma process using hydrogen ($H_2$) gas or a mixed gas of hydrogen ($H_2$) gas and nitrogen ($N_2$) gas can be used. The wet cleaning process and the plasma process are carried out at a temperature in a range from approximately a room temperature to approximately 400° C.

Also, after the ex-situ wet cleaning or dry cleaning process, the resulting substrate structure which is placed into the CVD apparatus can be subjected to a thermal process with use of a hydrogen-based gas. At this time, this thermal process is performed as an in-situ cleaning process and, can also be omitted. That is, the SPE-silicon structure 205 can be obtained even with or without performing the thermal process.

Furthermore, after the SPE-silicon structure 205 is formed at a temperature ranging from approximately 500° C. to approximately 700° C., a thermal process for regrowing the epitaxial silicon layer 205A can also be performed at a temperature ranging from approximately 550° C. to approximately 650° C. in an atmosphere of nitrogen for approximately 30 minutes to approximately 10 hours.

After the removal of the amorphous silicon layer 205B, the epitaxial silicon layer 205A can be pretreated with a wet cleaning process and/or a dry cleaning process before the first to the third metal layers 206, 207 and 208 are formed.

Especially, examples of the CVD apparatus at which the SPE-silicon structure 205 is formed are a low pressure (LP) CVD apparatus, a very low pressure (VLP) CVD apparatus, a plasma enhanced (PE) CVD apparatus, ultra-high vacuum (UHV) CVD apparatus, a rapid thermal (RT) CVD apparatus, an atmosphere pressure (AP) CVD apparatus, and a molecular beam epitaxy (MBE). The first to the third metal layers 206 to 208 can be formed in one of the above listed CVD apparatuses and a physical vapor deposition (PVD) apparatus. In addition, the SPE-silicon structure 205 is doped with phosphorus or arsenic (As).

In accordance with the preferred embodiment, the burial of the contact hole with the first to the third metal layers and the SPE-silicon structure obtained without performing the thermal process for the regrowth of the epitaxial layer provides an effect of reducing resistivity of the contact plug. Also, since the amorphous silicon layer is removed while the epitaxial silicon layer remains within the contact hole, it is not required to perform a subsequent thermal process at a temperature for approximately 550° C. to approximately 650° C. for regrowing the epitaxial silicon layer. As a result, it is possible to obtain the simplified process and the reduction of a thermal budget. Moreover, there is further effect that the contact plug formed in accordance with the present invention has a low contact resistance, and thus, it is possible to improve reliability and yields of semiconductor devices.

The present application contains subject matter related to the Korean patent application No. KR 42309, filed in the Korean Patent Office on Jun. 9, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, the method comprising:
   exposing a portion of a substrate structure to form a contact hole;
   forming an epitaxial silicon structure including an epitaxial silicon layer and an amorphous silicon layer within the contact hole by performing a solid phase epitaxy (SPE) method;
   removing the amorphous silicon layer; and
   forming a metal layer structure over the epitaxial silicon layer to thereby obtain a contact plug.

2. The method of claim 1, wherein the forming-an-epitaxial-silicon-structure step proceeds at a temperature ranging from approximately 500° C. to approximately 700° C. with use of a gas of $SiH_4$ and $PH_3$.

3. The method of claim 1, wherein the epitaxial silicon structure is doped with phosphorus, arsenic, or both, a doping concentration ranging from approximately $1 \times 10^{18}$ atoms/$cm^3$ to approximately $1 \times 10^{21}$ atoms/$cm^3$.

4. The method of claim 1, further including performing an in-situ thermal process using a hydrogen-based gas prior to forming the epitaxial silicon structure.

5. The method of claim 1, wherein the metal layer structure includes:
   a first metal layer formed on the epitaxial silicon layer;
   a second metal layer formed on the first metal layer; and
   a third metal layer formed on the second metal layer.

6. The method of claim 5, wherein the first metal layer comprises a material selected from a group consisting of Ti, Co and Ni.

7. The method of claim 5, wherein the second metal layer is a barrier layer including TiN, WN or both.

8. The method of claim 5, wherein the third metal layer includes tungsten.

* * * * *